(12) United States Patent
Huang et al.

(10) Patent No.: US 10,001,801 B2
(45) Date of Patent: *Jun. 19, 2018

(54) VOLTAGE PROVIDING CIRCUIT

(71) Applicant: TAIWAN SEMICONDUCTOR MANUFACTURING COMPANY, LTD., Hsinchu (TW)

(72) Inventors: I-Han Huang, Tainan (TW); Chia-En Huang, Xinfeng Township (TW); Chih-Chieh Chiu, Hsinchu (TW); Fu-An Wu, Hsinchu (TW); Chun-Jiun Dai, Taichung (TW); Hong-Chen Cheng, Hsinchu (TW); Jung-Ping Yang, Jui-bei (TW); Cheng Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/805,611

(22) Filed: Jul. 22, 2015

(65) Prior Publication Data

US 2015/0323951 A1 Nov. 12, 2015

Related U.S. Application Data

(63) Continuation of application No. 13/779,020, filed on Feb. 27, 2013, now Pat. No. 9,104,214.
(Continued)

(51) Int. Cl.
*G05F 1/10* (2006.01)
*G05F 3/02* (2006.01)
(Continued)

(52) U.S. Cl.
CPC ............... *G05F 3/242* (2013.01); *G05F 3/08* (2013.01); *G05F 3/24* (2013.01); *G11C 5/148* (2013.01); *H03K 19/00361* (2013.01)

(58) Field of Classification Search
CPC ... G11C 5/147; H03K 19/0016; G06F 1/3203; G06F 1/32; G06F 1/3296
(Continued)

(56) References Cited

U.S. PATENT DOCUMENTS 6,198,334 B1 3/2001 Tomobe et al.
6,242,898 B1 6/2001 Shimizu et al.
(Continued)

*Primary Examiner* — Quan Tra
(74) *Attorney, Agent, or Firm* — Hauptman Ham, LLP

(57) ABSTRACT

A voltage providing circuit includes a first circuit configured to receive a first input signal and a second input signal and to generate an output signal. The first circuit includes a first transistor configured to switchably couple the second input signal to a first node responsive to the first input signal, a second transistor having a gate terminal coupled with the first node, and a third transistor having a source terminal coupled with a source terminal of the second transistor. The third transistor is configured to set a reference voltage value at the source terminal of the second transistor if the first input signal indicates that the second input signal is pulled from a first voltage value toward a second voltage value and if the second input signal reaches a predetermined voltage value. A second circuit is configured to receive the output signal and to generate an output voltage.

20 Claims, 12 Drawing Sheets

Related U.S. Application Data

(60) Provisional application No. 61/680,059, filed on Aug. 6, 2012.

(51) Int. Cl.
*G05F 3/24* (2006.01)
*G05F 3/08* (2006.01)
*H03K 19/003* (2006.01)
*G11C 5/14* (2006.01)

(58) Field of Classification Search
USPC .............. 327/540, 541, 544, 546; 326/31–34
See application file for complete search history.

(56) References Cited

U.S. PATENT DOCUMENTS

| | | |
|---|---|---|
| 6,275,440 B2 | 8/2001 | Noda et al. |
| 6,335,639 B1 * | 1/2002 | Aingaran ........................ 326/95 |
| 6,366,151 B1 | 4/2002 | Nakamura |
| 6,518,848 B2 | 2/2003 | Teraishi |
| 7,030,664 B2 * | 4/2006 | Choe ................ H03K 19/01728 |
| | | 326/26 |
| 7,164,291 B2 | 1/2007 | Mair et al. |
| 7,276,932 B2 | 10/2007 | Kuang et al. |
| 7,560,955 B2 | 7/2009 | Takahashi et al. |
| 7,696,649 B2 | 4/2010 | Frey et al. |
| 8,331,188 B2 | 12/2012 | Nakaoka |
| 2002/0057120 A1 * | 5/2002 | Feng ............................ 327/206 |
| 2007/0183245 A1 | 8/2007 | Lee et al. |

\* cited by examiner

VOLTAGE PROVIDING CIRCUIT

PRIORITY CLAIM

The present application is a continuation of U.S. application Ser. No. 13/779,020, filed Feb. 27, 2013, which claims priority of U.S. Provisional Application No. 61/680,059, filed Aug. 6, 2012, which are incorporated herein by reference in their entireties.

FIELD

The present disclosure is related to a voltage providing circuit.

BACKGROUND

In some approaches, a wakeup sequence in a memory circuit constrains a wakeup current and a wakeup time, and causes a high leakage current. For the memory circuit to operate in different manufacturing processes, supply voltages, and temperatures (PVT), margins on electrical power, timing, and/or die areas need to be relaxed.

In a static random access memory (SRAM) chip, many daisy chain circuits are used in a wakeup sequence. The daisy chain circuits include a lot of inverters in different sections of the daisy chain. As a result, the die area for the SRAM chip is large, and the metal routing is complicated.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
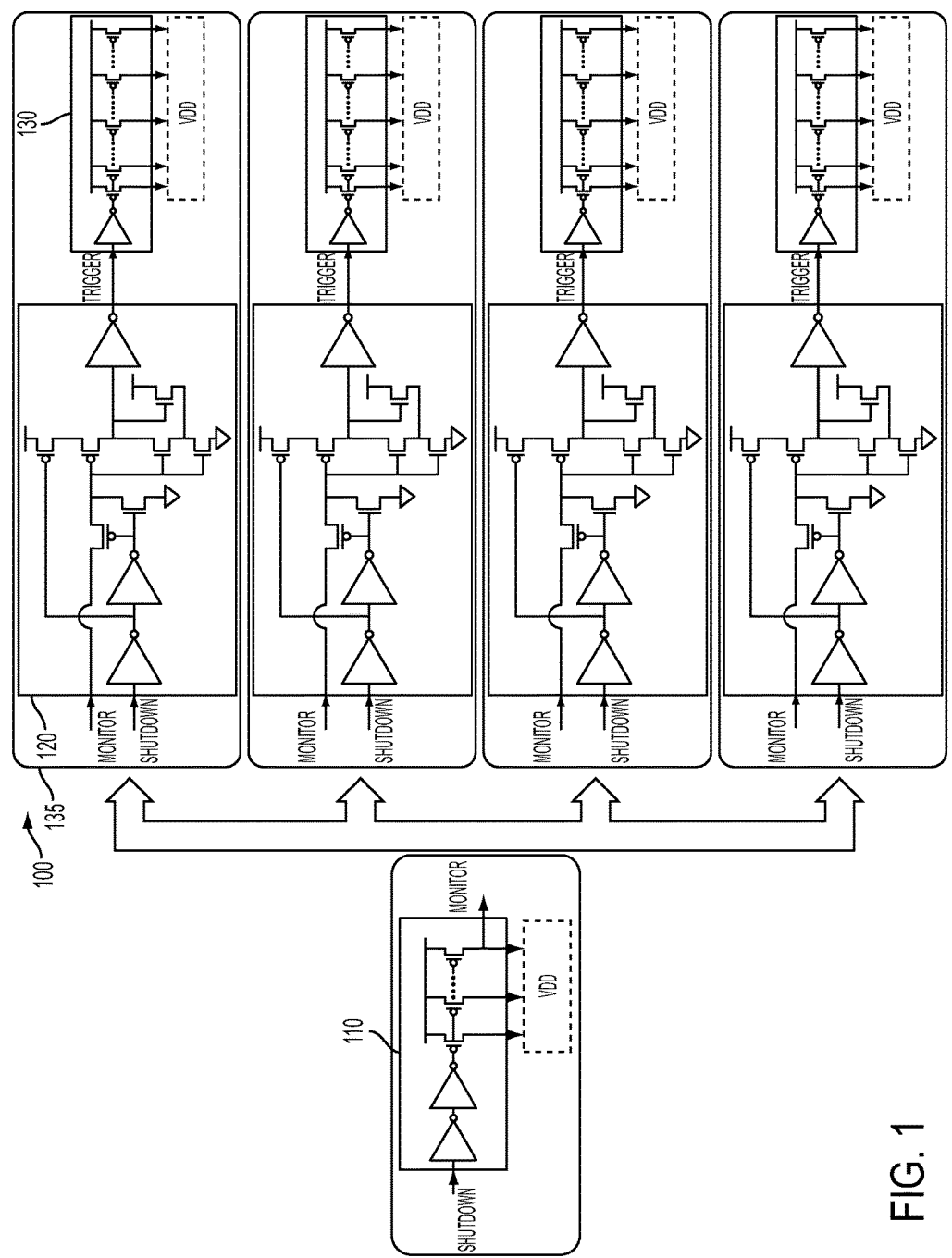
FIG. 1 is a diagram of a voltage providing circuit used to provide a supply voltage, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A voltage monitor is used to determine an amount of a header voltage for use in a wakeup sequence of a circuit. A power control mechanism is highly efficient. A chip floor plan in a memory macro is succinct. Analog trimming support is available. Compared with another approach, a power efficiency is increased, a standby leakage current and a die area are reduced. A control circuit is smaller and simpler.

Exemplary Voltage Providing Circuit

FIG. 1 is a diagram of a circuit 100, in accordance with some embodiments. Circuit 100 provides a plurality of supply voltages VDD to other circuits (not shown). Circuit 100 is also called a supply voltage providing circuit. Voltages VDD used as a supply voltage are for illustration. Voltage VDD used for other purposes are within the scope of various embodiments.

Circuit 100 includes a sub circuit 110 and a plurality of sub circuits 135. Each sub circuit 135 includes a sub circuit 120 and a sub circuit 130. For illustration, four sub circuits 135 are shown. As a result, four sub circuits 120 and four sub circuits 130 are shown. A different number of sub circuit 110 and/or sub circuits 135 are within the scope of various embodiments.

Sub circuit 110 receives a signal ShutDown and generates a signal Monitor for use by sub circuits 120. Sub circuit 110 also provides a plurality of supply voltages VDD for use by other circuits (not shown). Sub circuit 110 is also called a signal Monitor generating circuit. Each sub circuit 120 receives signal ShutDown and signal Monitor, and generates a corresponding signal Trigger for use by a corresponding sub circuit 130. Sub circuit 120 is also called a signal Trigger generating circuit. Each sub circuit 130 receives a corresponding signal Trigger and generates a plurality of supply voltages VDD. In some embodiments, supply voltages VDD in circuit 100 and in other circuits that use circuit 100 are coupled together.

In some embodiments, a sub circuit 135, including a pair of sub circuit 120 and sub circuit 130, is part of a section of a memory macro. Sub circuit 130 is also called a supply voltage providing sub circuit. When circuits in the section of the memory macro are invoked and demand supply voltages VDD, the corresponding sub circuit 135 is activated to provide supply voltages VDD to the section of the memory macro. Details of how sub circuits of circuit 100 are used in a memory macro are illustrated with reference to FIG. 11 below. Sub circuits of circuit 100 used in a memory macro are for illustration. Sub circuits of circuit 100 being used with other circuits are within the scope of various embodiments.

Details of embodiments of circuits 110, 120, and 130 are explained with reference to FIGS. 2 to 10.

Signal Monitor Generating Circuit

Figure 2:
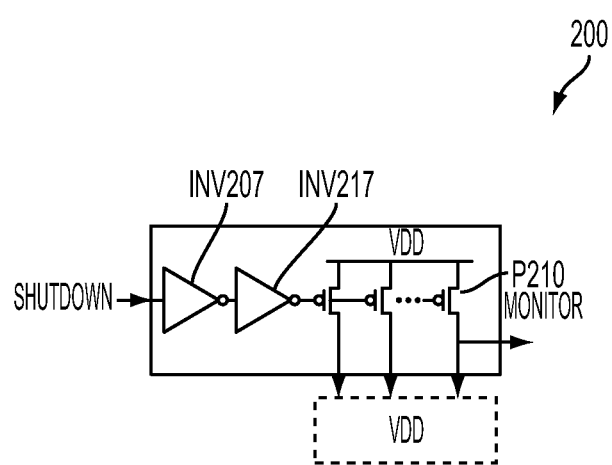
FIG. 2 is a diagram of a signal Monitor generating circuit of a first sub circuit of the voltage providing circuit in FIG. 1, in accordance with some embodiments.

FIG. 2 is a diagram of a circuit 200, in accordance with some embodiments. Circuit 200 is an embodiment of signal Monitor generating circuit 110 in FIG. 1.

Circuit 200 includes a first inverter INV207, a second inverter INV217, and a plurality of PMOS transistors P210 coupled in parallel. For simplicity, one PMOS transistor P210 is labeled. Gates of PMOS transistors 210 are coupled together and to an output of inverter INV217. Sources of PMOS transistors P210 receive supply voltage VDD, and drains of PMOS transistors P210 provide supply voltage VDD received from the sources of PMOS transistors P210 when PMOS transistors P210 are turned on. For example, when signal ShutDown is logically low, the output of inverter INV217 or the gates of PMOS transistors P210 are also logically low. PMOS transistors P210 are therefore turned on. As a result, by operations of PMOS transistors P210, the drains of PMOS transistors 210 receive voltage VDD from the sources of PMOS transistors 210. In contrast, when signal ShutDown is logically high, the output of inverter INV217 coupled with the gates of PMOS transistors P210 are logically high. PMOS transistors P210 are therefore turned off, and function as an open circuit. In such a situation when PMOS transistors P210 are turned off, the sources of PMOS transistors P210 are floating in some embodiments. The number of PMOS transistors 210 in circuit 200 is selected to provide current for circuits that use supply voltages VDD. For example, when the circuits that use supply voltages VDD demand a higher amount of current, a higher number of PMOS transistors P210 is used. But if the circuits that use supply voltages VDD demand a lesser amount of current, a smaller number of PMOS transistors P210 is used.

In some embodiments, signal ShutDown is logically high when circuit 100 in FIG. 1, circuit 200, and other circuits that use circuits 100 and 200 are in a shutdown or power down mode. In contrast, signal ShutDown is logically low when circuit 100, circuit 200, and other circuits that use circuits 100 and 200 are in an active mode. For example, in an active mode, the memory macro in FIG. 11 that uses circuit 200 is in a read or write mode.

Circuit 200 also generates signal Monitor at the sources of PMOS transistors P210 that are coupled together. Effectively, signal Monitor has a same voltage level as supply voltage VDD. In some embodiments, when signal Shut-Down is logically high, circuit 100 is in a shutdown or power down mode, and signal Monitor is floating. But when signal ShutDown is logically low, circuit 200 is in an active mode, and signal Monitor is logically high.

Signal Trigger Generating Circuit

Figure 3:
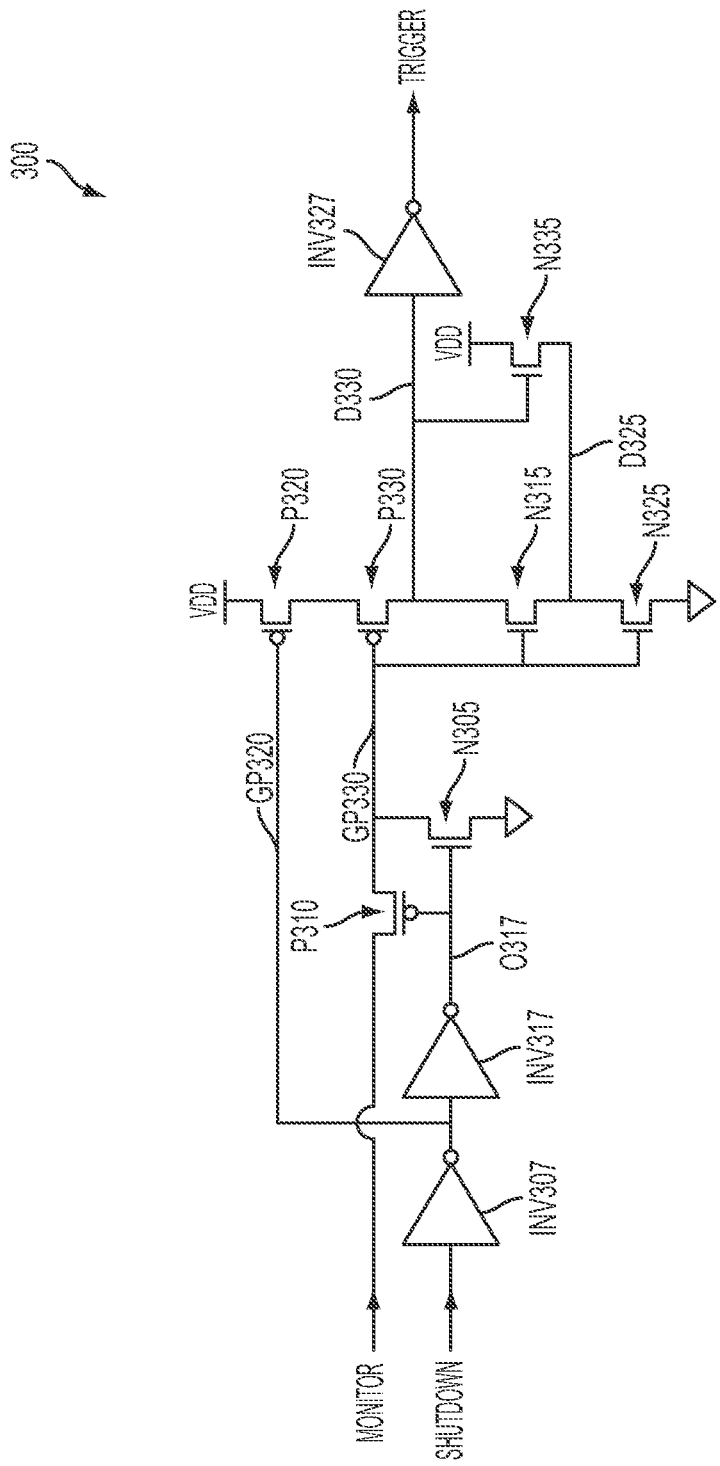
FIG. 3 is a diagram of a signal Trigger generating circuit of a second sub circuit of the voltage providing circuit in FIG. 1, in accordance with some embodiments.

FIG. 3 is a diagram of a circuit 300, in accordance with some embodiments. Circuit 300 is an embodiment of signal Trigger generating circuit 120 in FIG. 1.

When signal ShutDown is logically high, an output 0317 of an inverter INV317 is also logically high based on operations of inverters INV307 and INV317. Output 0317 is also coupled with gates of PMOS transistor P310 and of NMOS transistor N305. As a result, PMOS transistor P310 is turned off, and NMOS transistor N305 is turned on. Consequently, node GP330 at a drain of NMOS transistor N305 is pulled to a low logical value at a source of NMOS transistor N305. Node GP330 is also at a gate of PMOS transistor P330. PMOS transistor P330 is therefore turned on. At that time, node GP320 at an output of inverter INV307 and at a gate of PMOS transistor P320 is logically low. As a result, PMOS transistor P320 is turned on. Effectively, both PMOS transistors P320 and P330 are turned on.

Node GP330 is also coupled with gates of NMOS transistors N315 and N325. NMOS transistors N315 and N325 are therefore turned off based on the low logical value of node GP330. Because NMOS transistors N315 and N325 are turned off and PMOS transistors P320 and P330 are turned on, node D330 at a drain of PMOS transistor P330 is pulled to a high logical value of supply voltage VDD at a source of PMOS transistor P320. Signal Trigger, through inverter INV327, is therefore logically low. By operations of circuit 130 in FIG. 1, when signal Trigger is logically low, supply voltage VDD is cut off to other circuits that use circuit 100. Explain in a different way, when signal Shut-Down is logically high, circuit 120, circuit 100, and circuits that use circuit 120 and circuit 100 are in a shutdown or power down mode.

In contrast, when signal ShutDown is logically low, signal 0317 is also logically low. As a result, PMOS transistor P310 is turned on, and NMOS transistor N305 is turned off. When signal Monitor reaches a high logical value, node GP330 is logically high, which turns off PMOS transistor P330, and turns on NMOS transistors N315 and N325. Because signal ShutDown is logically low, signal GP320 is logically high by operation of inverter INV307, and PMOS transistor P320 is turned off. Because PMOS transistors P320 and P330 are turned off and NMOS transistors N315 and N325 are turned on, node D330 at the drain of NMOS transistor N315 is pulled to a low logical value of ground at the source of NMOS transistor N325. As a result, by operation of inverter INV327, signal Trigger is logically high. By operation of circuit 130 in FIG. 1, when signal Trigger is logically high, circuits 130 provide supply voltage VDD to other circuits. Explained in a different way, when signal ShutDown is logically low, circuit 130, circuit 100, and other circuits that use circuit 130 are out of the shutdown mode, and enter an active mode, such as a read or a write mode in the memory macro in FIG. 11, for example.

In some embodiments, signal Monitor has a slew rate slower than that of other signals including signal ShutDown because signal Monitor has a heavier load. For example, signal Monitor is fed to a plurality of circuits 120. As a result, the slew rate of signal Monitor is slower than the slew rate of signal ShutDown. Circuit 300 is designed to adapt to the slow slew rate of signal Monitor. In some embodiments, signal Trigger has a faster slew rate even though signal Monitor has a slower slew rate. In some embodiments, signal Trigger has a slew rate faster than that of signal Monitor.

NMOS transistors N315, N325, and N335 form a Schmidt trigger circuit. By operations of NMOS transistor N315, to turn on NMOS transistor N315, voltage GP330 at the gate of NMOS transistor N315 is higher than a threshold voltage of NMOS transistor N315. For illustration, the threshold voltage of NMOS transistor N315 is called voltage VthN315.

In some embodiments, NMOS transistor N325 is turned on before NMOS transistor N315 because the source of NMOS transistor N325 is at a ground level while the source of NMOS transistor N315 or the source of NMOS transistor N335 is at a voltage level higher than ground. When both NMOS transistors N315 and N325 are turned on, node D330 is pulled to ground at the source of NMOS transistor N325. NMOS transistor N335 is therefore turned off. When both PMOS transistors P320 and P330 are turned on, node D330 is pulled to voltage VDD at the source of PMOS transistor P320. As a result, NMOS transistor N335 is turned on. Consequently, node D325 is at voltage VDD−VthN335 wherein VthN335 is a threshold voltage of NMOS transistor N335.

Because signal Monitor has a slow slew rate, signal Monitor transitions from a low to a high logical value slowly. Signal D330, however, has a slew rate sharper than that of signal Monitor. For example, when signal Monitor reaches a high voltage value to turn on NMOS transistors N315 and N325, NMOS transistors N315 and N325 together provide a large current to quickly pull signal D330 to a low logical value. In other words, signal D330 has a faster slew rate based on the pull down capability of NMOS transistors N315 and N325. Because signal D330 has a fast slew rate, signal Trigger also has a fast slew rate. In addition, inverter INV327, when converting signal D330 to form signal Trigger, also increases the slew rate of signal Trigger. In some embodiments, the slew rate of signal Trigger is faster than the slew rate of signal Monitor. In some embodiments, sizes of one or a combination of NMOS transistors N315, N325 and N335 and of transistors in inverter INV327 are selected to provide a desired slew rate of signal Trigger.

Supply Voltage Providing Sub Circuit

Figure 4:
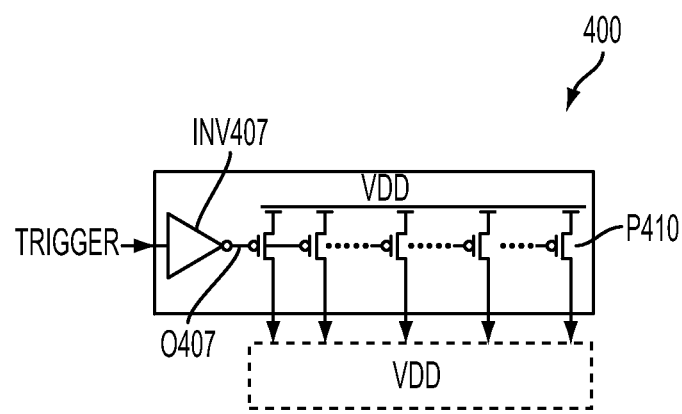
FIG. 4 is a diagram of a supply voltage providing sub circuit of a third sub circuit of the voltage providing circuit in FIG. 1, in accordance with some embodiments.

FIG. 4 is a diagram of a circuit 400, in accordance with some embodiments. Circuit 400 is an embodiment of supply voltage providing sub circuit 130 in FIG. 1.

Circuit 400 includes an inverter INV407 and a plurality of PMOS transistors P410 coupled in parallel. For simplicity, one PMOS transistor P410 is labeled. Gates of PMOS transistors P410 are coupled together and receive signal 0407 at an output of inverter INV407. The number of PMOS transistors 410 in circuit 400 is selected to provide current for circuits that use supply voltages VDD. For example, when the circuits that use supply voltages VDD demand a higher amount of current, a higher number of PMOS transistors P410 is used to form circuit 400. But if the circuits that use supply voltages VDD demand a lesser amount of current, a smaller number of PMOS transistors P410 is used.

When signal Trigger is logically high, signal 0407 is logically low, and PMOS transistors P410 are turned on. Drains of PMOS transistors P410 are pulled to supply voltage VDD at sources of PMOS transistors 410. Effectively, when signal Trigger is logically high, supply voltage VDD at the source of PMOS transistors P410 is provided to the drains of PMOS transistors P410. In some embodiments, supply voltage VDD at the drains of PMOS transistors P410 is provided to other circuits using circuit 400.

In contrast, when signal Trigger is logically low, signal 0407 and the gates of PMOS transistors P410 are logically high. As a result, PMOS transistors P410 are turned off and function as an open circuit. Effectively, supply voltage VDD at the drains of PMOS transistors P410 is cut off from other circuits that use circuit 400 and/or circuit 100.

Additional Embodiments of Signal Trigger Generating Circuit

Figure 5:
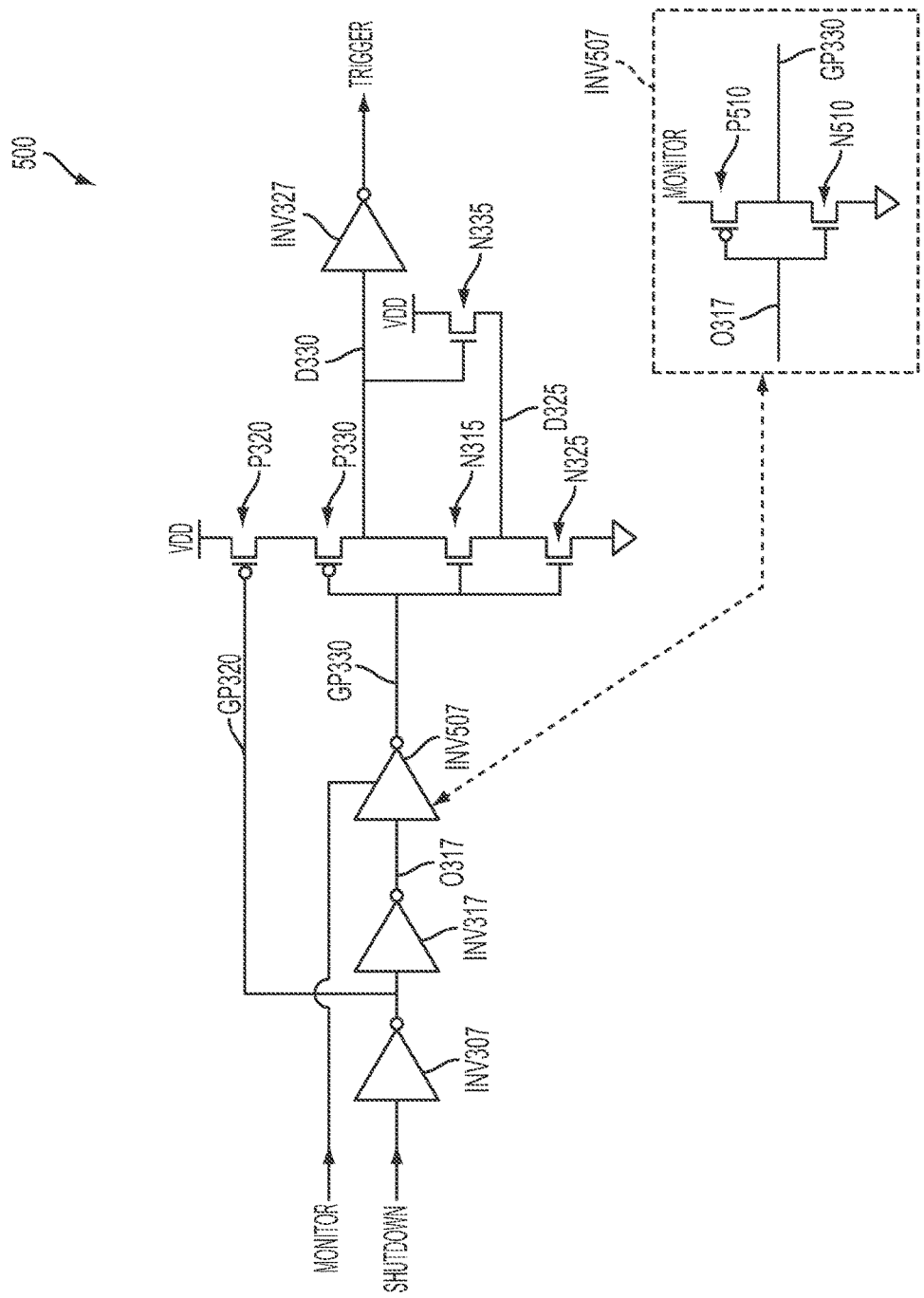
FIGS. 5-10 are diagrams of additional embodiments of the first sub circuit of the voltage providing circuit in FIG. 1, in accordance with some embodiments.

FIG. 5 is a diagram of a circuit 500, in accordance with some embodiments. Circuit 500 is another embodiment of signal Trigger generating circuit 120 in FIG. 1.

Compared with circuit 300, which is also an embodiment of signal Trigger generating circuit 120, an inverter INV507 is used in place of PMOS transistor P310 and NMOS transistor N305. Signal Monitor is used as a supply voltage for inverter INV507. In some embodiments, inverter INV507 includes a PMOS transistor P510 coupled in series with an NMOS transistor N510. Signal Monitor is applied to a source of PMOS transistor P510. Signal GP330 is provided at an output of inverter INV507. In the embodiment of FIG. 5, a voltage level of signal GP330 at a drain of PMOS transistor P510 follows a voltage level of signal Monitor at a source of PMOS transistor P510 when PMOS transistor P510 is turned on.

In some embodiments, inverters INV307 and INV317 use supply voltage VDD. Further, as shown in FIG. 5, inverter INV507 uses voltage Monitor as a supply voltage. In some embodiments, a high voltage level of signal Monitor is different from voltage VDD. Expressed in a different way, circuit 500 uses two different supply voltage domains, a supply voltage VDD domain and a voltage Monitor domain.

Figure 6:
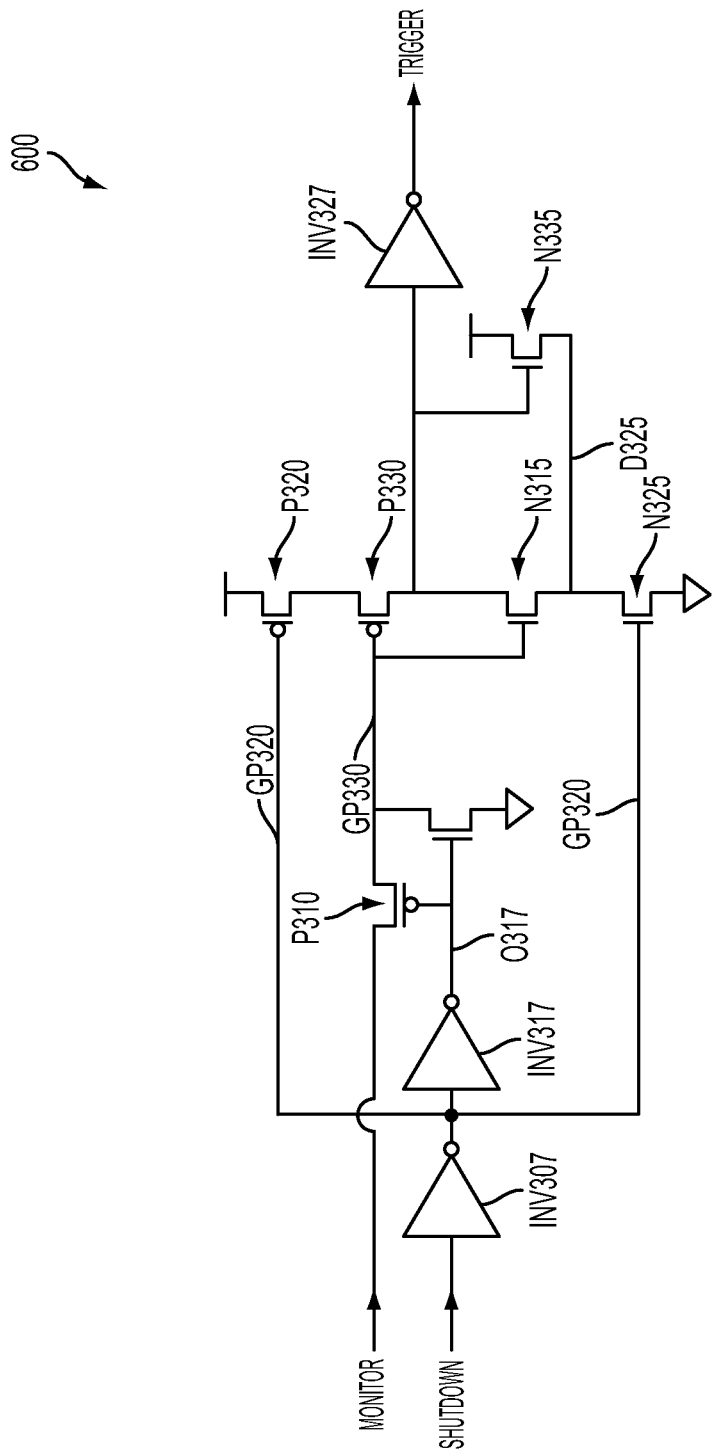

FIG. 6 is a diagram of a circuit 600, in accordance with some embodiments. Circuit 600 is another embodiment of signal Trigger generating circuit 120 in FIG. 1.

Compared with circuit 300 in FIG. 3, which is also an embodiment of signal Trigger generating circuit 120, the gate of NMOS transistor N325 is not coupled with the gate of NMOS transistor N315, nor the gate of PMOS transistor P330. The gate of NMOS transistor N325, however, is coupled with the output of inverter INV307 or node GP320, which is also coupled with the gate of PMOS transistor P320.

In some embodiments, signal Monitor is provided by a voltage domain different from the supply voltage VDD domain used by signal ShutDown. Signal GP320 inverted from signal ShutDown is also in the supply voltage VDD domain. For illustration, the voltage domain for signal Monitor is called a Monitor domain. As a result, the gates of PMOS transistor P320 and of NMOS transistor N325 are of supply VDD domain. In contrast, when PMOS transistor P310 is turned on, signal Monitor at a source of PMOS transistor P310 is transferred to a drain of PMOS transistor P310 or the gate of PMOS transistor P330. As a result, the gate of PMOS transistor P330 is of voltage Monitor domain.

In some embodiments, NMOS transistor N325 is turned on before NMOS transistor N315 for at least the following reasons. For example, the source of NMOS transistor N325 is at a ground level while the source of NMOS transistor N315 is at a voltage level higher than ground. For another example, when signal ShutDown is logically low, signal GP320 is logically high, and NMOS transistor N325 is turned on, but NMOS transistor N315 is not turned on until signal Monitor reaches a voltage level higher than a threshold voltage of NMOS transistor N315. In some embodiments, a slew rate of signal Monitor is slower than that of signal ShutDown. As a result, signal Monitor reaches a logical high value slower than signal ShutDown. The sequence of turning on NMOS transistor N325 before turning on NMOS transistor N315 is similar to that of circuit 300 in FIG. 3. In some embodiments, a voltage level of signal Monitor is controlled to turn on NMOS transistor N315 at a desired time. In some other embodiments, sizes of NMOS transistor N315 and/or of NMOS transistor N325 are adjusted so that NMOS transistor N315 is turned on at a predetermined voltage value of signal Monitor. Examples of predetermined voltage values of signal Monitor include 60%, 70%, 80%, etc., of voltage VDD.

Figure 7:
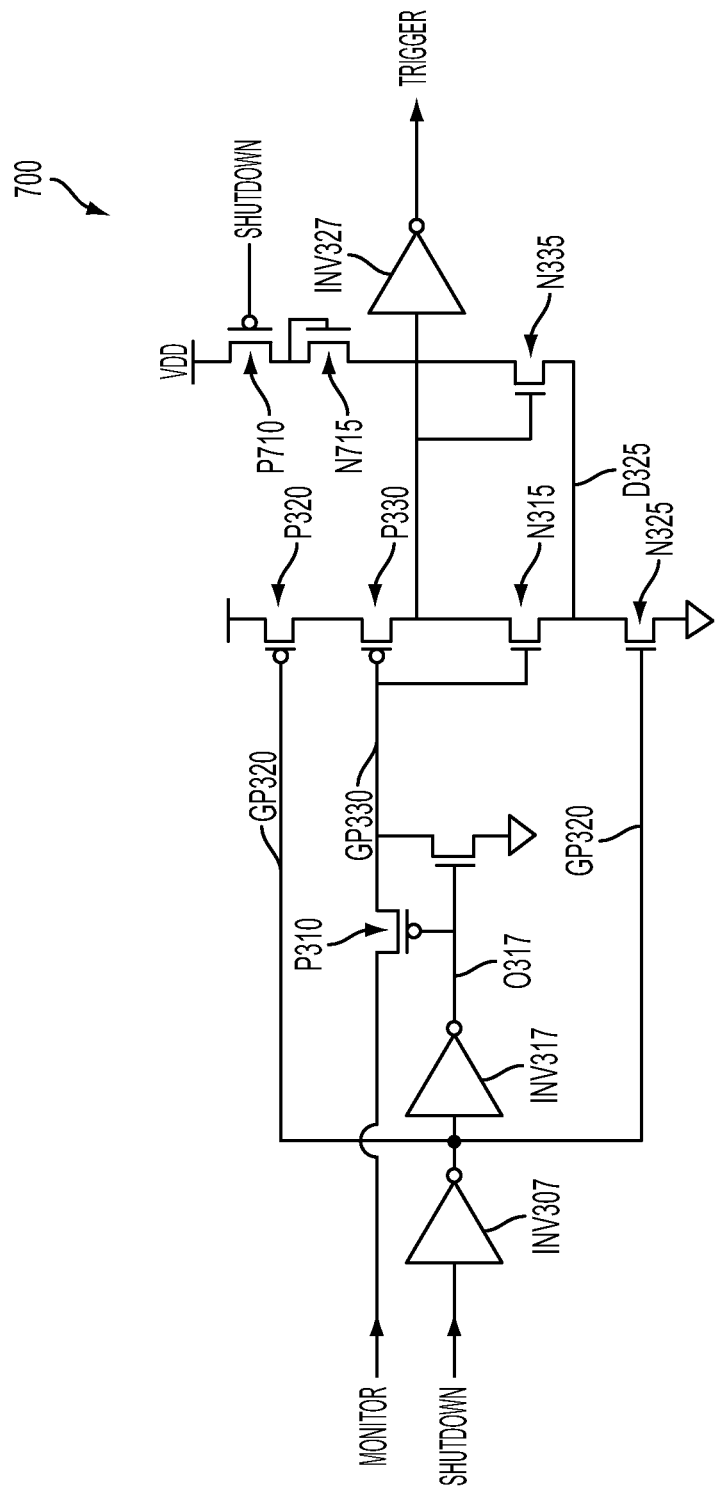

FIG. 7 is a diagram of a circuit 700, in accordance with some embodiments. Circuit 700 is another embodiment of signal Trigger generating circuit 120 in FIG. 1.

Compared with circuit 600 in FIG. 6, circuit 700 additionally includes a PMOS transistor P710 and an NMOS transistor N715 configured as a diode. PMOS transistor P710 is coupled in series with diode or NMOS transistor N715, which is in turn coupled in series with NMOS transistor N335.

PMOS transistor P710, diode or NMOS transistor N715, and NMOS transistor N325 control voltage values of a voltage D325 at a drain of NMOS transistor N325 coupled with a source of NMOS transistor N315. In some embodiments, voltage D325 is voltage VDD at a source of PMOS transistor P710 subtracted from voltage VSDP710 (not labeled), voltage VDN715 (not labeled), and voltage VDSN335 (not labeled) wherein voltage VSDP170 is a voltage drop across the source and the drain of PMOS transistor P710, voltage VDN715 is a voltage drop across diode or NMOS transistor N715, and voltage VDSN335 is a voltage drop across a drain and a source of NMOS transistor N335. In some embodiments, voltages VDD, VDSP710, VDN715, and VDSN335 are about 0.9 V, 0.1 V, 0.3 V, and 0.1 V, respectively. As a result, voltage D325 is about 0.4 V. Other values of each of voltages VDD, VDSP710, VDN715, and VDSN335 are within the scope of various embodiments.

In some embodiments, voltage D325 is controlled to control a time to turn on and off NMOS transistor N315. For example, to turn on NMOS transistor N315 at a later time, voltage D325 is increased. In contrast, turn on NMOS transistor N315 at an earlier time, voltage D325 is decreased.

In FIG. 7, a voltage value VDD is used at the source of PMOS transistor P710 for illustration, a different voltage value is within the scope of various embodiments. For example, other circuits in FIG. 7 and/or FIG. 1 use the supply voltage VDD domain while the source of PMOS transistor P710 is supplied with a voltage value of another voltage domain different from the supply voltage VDD domain. For another example, the supply voltage VDD domain is about 0.9 V while the other voltage domain is lower or higher than the supply voltage VDD domain, including, for example, 0.8 V, 0.85 V, 1.0 V, 1.05 V, etc.

Transistors P710 and N715 are used for illustration. Other transistors, devices and/or circuits used to control voltage values of voltage D325 are within the scope of various embodiments. For example, a diode or a PMOS transistor configured as a diode is used in place of NMOS transistor N715. For another example, additional diodes and/or transistors configured as diodes are inserted between voltage VDD and NMOS transistor N335 are used to further lower voltage D325. Similar, PMOS transistor 710 or NMOS transistor N715 is removed to increase voltage D325. Such an exemplary circuit is illustrated in FIG. 8.

In some embodiments, a voltage value of voltage D325 is determined to turn on NMOS transistor N315 at a predetermined time. NMOS transistor N315 is also turned on at a time relative to a turn-on time of NMOS transistor N325. One or a combination of a voltage value at the source of PMOS transistor P710, a size of PMOS transistor P710, a size of NMOS transistor N715 and of NMOS transistor N335 is then determined to provide voltage D325.

Figure 8:
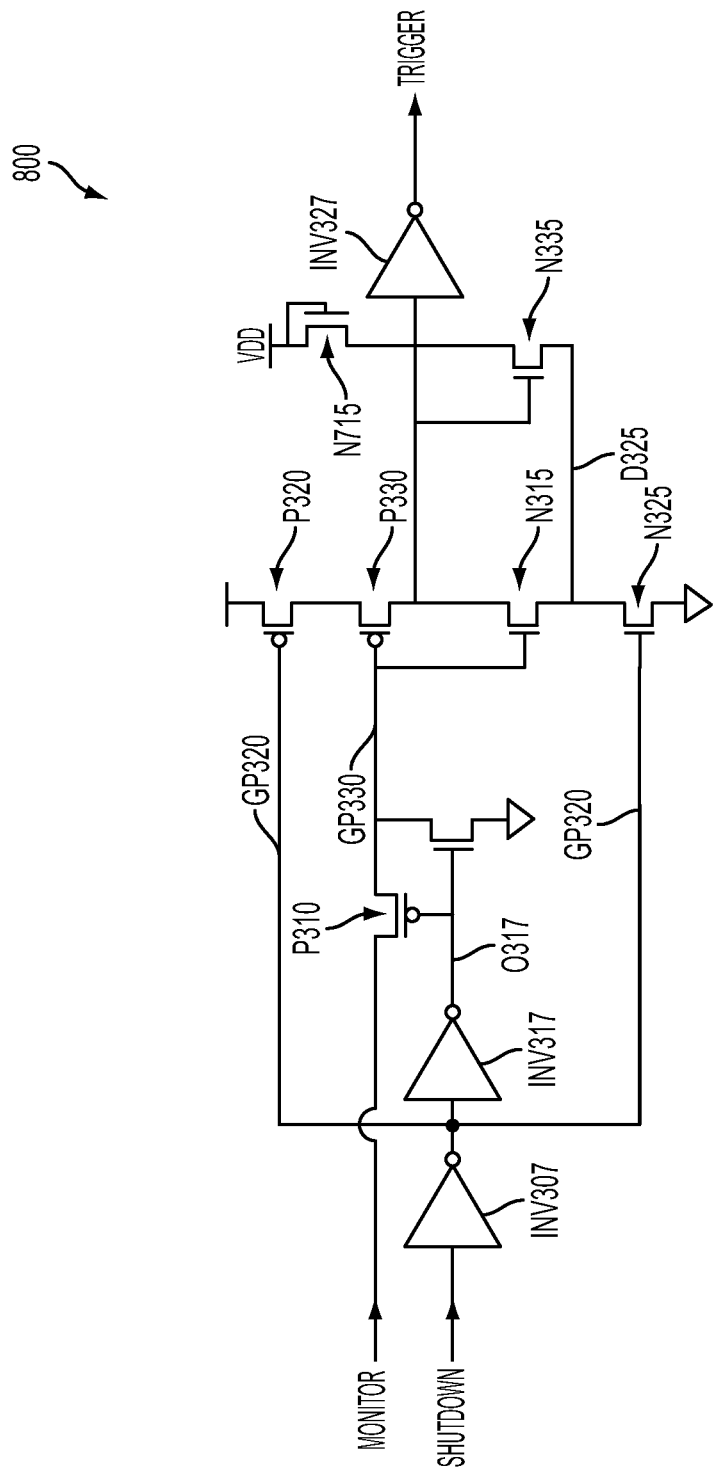

FIG. 8 is a diagram of a circuit 800, in accordance with some embodiments. Circuit 800 is another embodiment of signal Trigger generating circuit 120 in FIG. 1.

Compared with circuit 700 in FIG. 7, circuit 800 does not include PMOS transistor P710. The drain of NMOS transistor N715 receives supply voltage VDD. As a result, voltage D325 is voltage VDD at the drain of NMOS transistor N715 subtracted from voltages VDN715 and VDSN335.

Similar to FIG. 7, in FIG. 8, a voltage value VDD is used at the drain of NMOS transistor N715 for illustration, a different voltage value is within the scope of various embodiments. For example, other circuits in FIG. 8 and/or FIG. 1 use the supply voltage VDD domain while the drain of NMOS transistor N715 is supplied with a voltage value of another voltage domain different from supply voltage VDD domain. For another example, the supply voltage VDD domain is about 0.9 V while the other voltage domain is 0.8 V, 0.85 V, 1.0 V, 1.05 V, etc.

Figure 9:
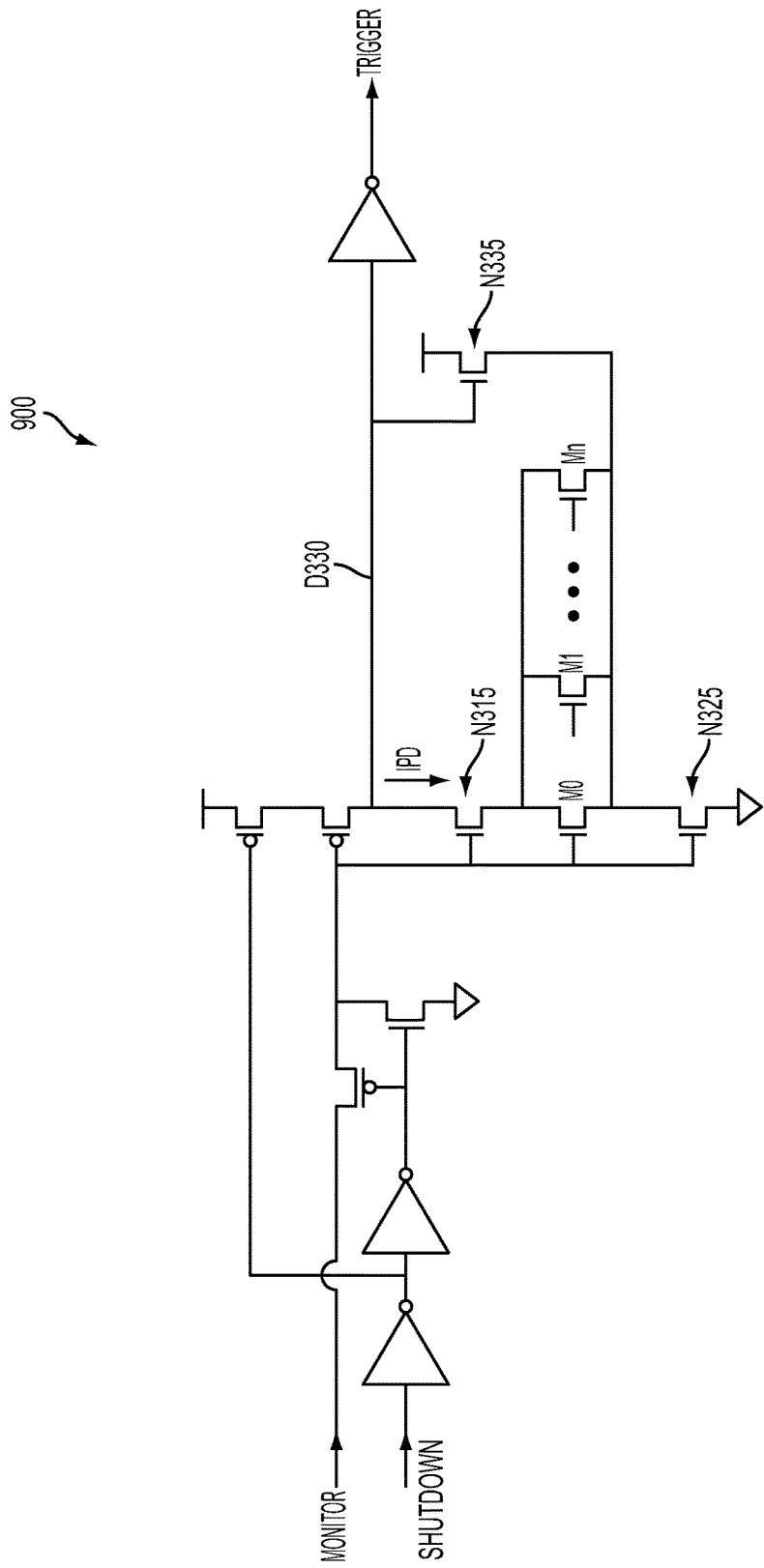

FIG. 9 is a diagram of a circuit 900, in accordance with some embodiments. Circuit 900 is another embodiment of signal Trigger generating circuit 120 in FIG. 1.

Compared with circuit 300 in FIG. 3, which is also an embodiment of signal Trigger generating circuit, circuit 900 further includes a plurality of NMOS transistors M0, M1, . . . , Mn wherein n is an integer number. For simplicity, various elements of circuit 900 corresponding to elements of circuit 300 are not labeled. NMOS transistors M0 to Mn are coupled in parallel in between NMOS transistors N315 and N325. Drains of NMOS transistors M0 to Mn are coupled together and are coupled with the source of NMOS transistor N315 while the sources NMOS transistors M0 to Mn are coupled together and are coupled with the drain of NMOS transistor N325 and with the source of NMOS transistor N335.

In some embodiments, a slew rate for node D330 to transition from a high logical value to a low logical value depends on a value of a current IPD flowing through NMOS transistor N315, transistors M0 to Mn, and NMOS transistor N325. The higher the value of current IPD, the faster node D330 transitions to a low logical value. In contrast, the lower the value of current IPD, the slower node D330 transitions to the low logical value.

In some embodiments, transistors M0 to Mn are used to control the transition from a high to a low logical value of node D330. For example, each of transistors M0 to Mn provides additional current to current IPD to pull node D330 from a high to a low logical value. For example, a higher the number of NMOS transistors M0 to Mn is turned on, a larger the value of current IPD is. In contrast, a lower the number of NMOS transistors M0 to Mn is turned on, a smaller the value of current IPD is. Effectively, a higher number of NMOS transistors M0 to Mn is turned on, the faster node D330 transitions to the low logical value while a lower number of NMOS transistors M0 to Mn is turned on, the slower node D330 transitions to the low logical value. The ability to control transistors M0 to Mn is called an analog trimming capability.

The transition from a high to a low logical value of node D330 affects a transition from a low to a high logical value of signal Trigger, and the time to turn on circuits 120 that provide supply voltage VDD to other circuits.

Figure 10:
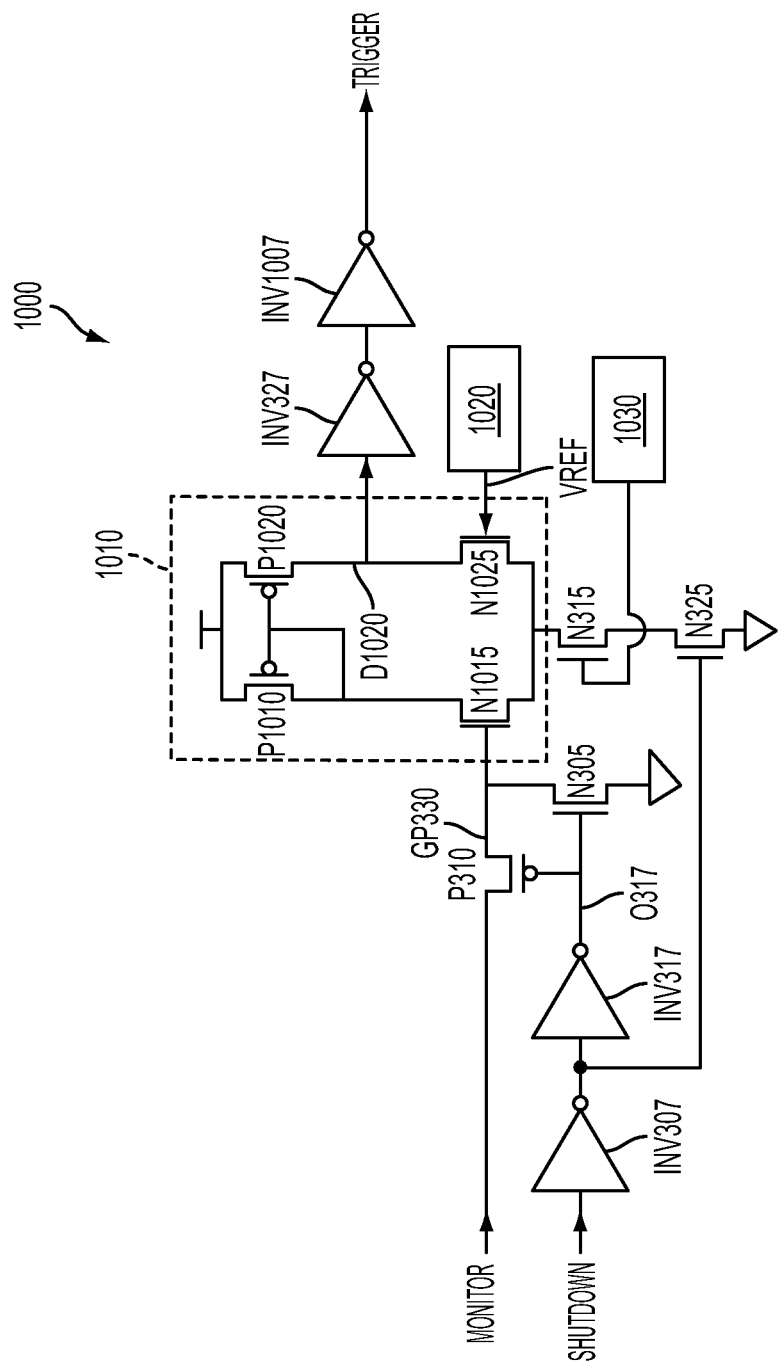

FIG. 10 is a diagram of a circuit 1000, in accordance with some embodiments. Circuit 1000 is another embodiment of signal Trigger generating circuit 120 in FIG. 1.

Compared with circuit 600 in FIG. 6, which is also another embodiment of signal Trigger generating circuit, in circuit 1000, a comparator 1010 replaces PMOS transistors P320 and P330 in FIG. 6. Comparator 1010 includes a PMOS transistor P1010, a PMOS transistor P1020, an NMOS transistor N1015, and an NMOS transistor N1025. Circuit 1000 does not include NMOS transistor N335, but additionally includes an inverter INV1007, a Vref circuit 1020, and a bias circuit 1030.

Node GP330 is coupled with a gate of NMOS transistor N1015. An output of Vref circuit 1020 is coupled with a gate of NMOS transistor N1025. Drains of NMOS transistors N1015 and N1025 are coupled together and with the drain of NMOS transistor N315. An output of bias circuit 1030 is coupled with the gate of NMOS transistor N315. A drain of PMOS transistor P1020 is coupled with a drain of NMOS transistor N1015, and serves as an input of inverter INV327.

An output of inverter INV327 is coupled with an input of inverter INV1007. An output of inverter INV1007 carries signal Trigger.

NMOS transistors N315 and N325 serve as a current path for comparator 1010. Circuit 1020 provides a reference voltage VREF to a gate of NMOS transistor N1025. Bias circuit 1030 provides a voltage to the gate of NMOS transistor N315 to turn on and off NMOS transistor N315.

A logical value of signal D1020 depends on voltage VREF and voltage GP330. For example, when voltage GP330 is greater than voltage VREF, signal D1020 is logically high, and signal Trigger is also logically high. In some embodiments, voltage VREF is selected to control when signal D1020 and signal Trigger are to be logically high. For illustration, signal Monitor and signal GP330 transition from a low to a high logical value, and voltage VREF is set at a predetermined voltage value. As soon as signal GP330 reaches a voltage level higher than voltage VREF, signal D1020 and thus signal Trigger are logically high. As a result, if voltage VREF is at a lower voltage value, signal Trigger turns logically high at an earlier time. But if voltage VREF is at a higher voltage value, signal Trigger turns logically high at a later time. When signal Trigger is logically high, supply voltage VDD at the sources of PMOS transistor P410 in FIG. 4 is provided to other circuits. Effectively, voltage VREF is selected to control when supply voltage VDD is provided to other circuits.

Application of Circuit Elements in Circuit 100 in a Memory Macro

Figure 11:
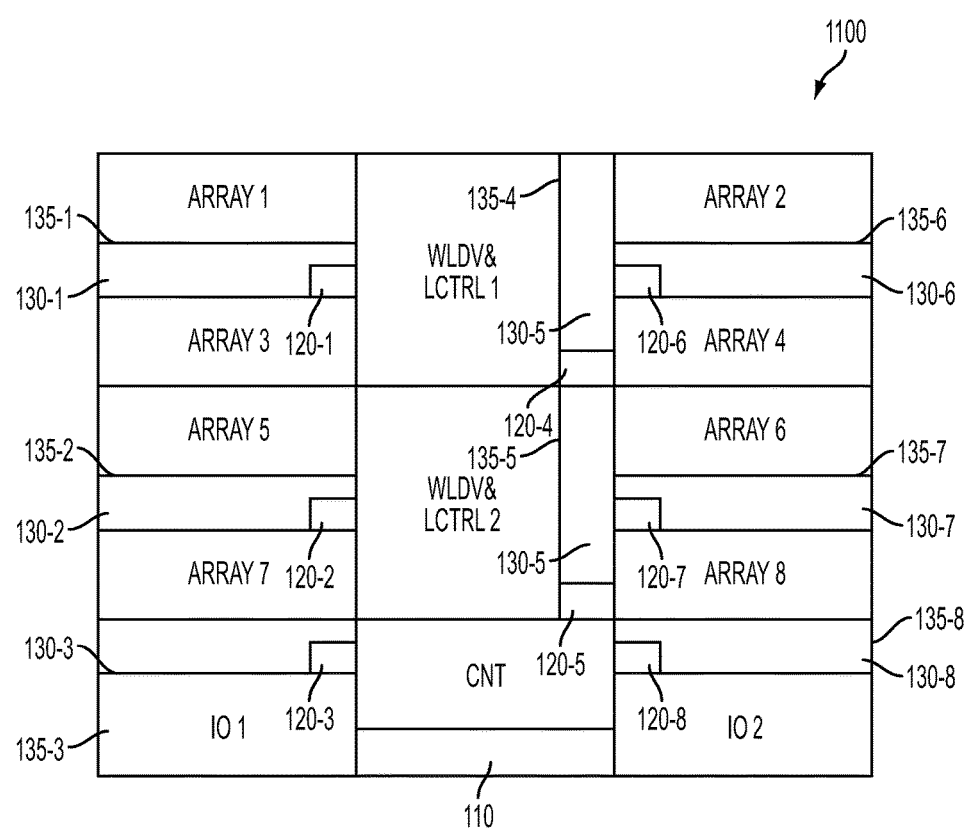
FIG. 11 is a diagram of a memory macro using circuit elements of the voltage providing circuit in FIG. 1, in accordance with some embodiments.

FIG. 11 is a diagram of a memory macro 1100, in accordance with some embodiments. For illustration, memory macro 1100 is a static random access memory (SRAM) macro. Other types of memory macros are within the scope of various embodiments.

Memory macro 100 includes a control circuit CTN, input and output control circuits IO 1 and IO 2, word line drivers and control circuits WLDV & LCTRL 1 and WLDV & LCTRL 2, and memory arrays ARRAY 1 to ARRAY 8.

Each of memory arrays ARRAY 1 to 8 includes a plurality of memory cells arranged in rows and columns. Each of word line drivers and control circuits WLDV & LCTRL 1 and 2 controls corresponding word lines and local input-outputs for use by corresponding memory cells in memory arrays ARRAY 1 to 8. Each of input-output control circuits IO 1 and 2 serves to transfer data between corresponding memory cells and other circuits outside of memory macro 1100. Control circuit CNT provides the row address, and the column address pre-decode, clock, and other signals for memory macro 1100. Control circuit CNT also controls data transfers between memory cells in memory arrays ARRAY 1 to 8 and circuits outside of memory macro 1100.

Memory macro 1100 also includes circuit 110 as part control circuit CNT, and eight circuits 135-1 to 135-8 in eight different locations. Circuit 135-1 is shared between memory arrays ARRAY 1 and ARRAY 3. Circuit 135-2 is shared between memory arrays ARRAY 5 and ARRAY 7. Circuit 135-6 is shared between memory arrays ARRAY 2 and ARRAY 4, and circuit 135-7 is shared between memory arrays ARRAY 6 and ARRAY 8. Circuits 135-3 and 135-8 are in input-output control circuits IO 1 and IO 2, respectively. Circuits 135-4 and 135-5 are in word line drivers and control circuits WLDR & LCTRL 1 and WLDR & LCTRL 2, respectively. Each of circuits 135-1 to 135-8 includes a corresponding circuit 120-1 to 120-8 and a corresponding circuit 130-1 to 130-8.

In some embodiments, when circuits in a section of memory macro 1100 demand supply voltages VDD, circuit 110 and a corresponding circuit 135 (i.e., 135-1 through 135-8) is turned on to provide corresponding supply voltages VDD. For example, when input-output control circuit IO 1 is turned on, circuit 110 and circuits 120-3 and 130-3 in circuit 135-3 are invoked to provide supply voltages VDD at the drains of PMOS transistors P410 in FIG. 4 to the circuits in input-output control circuit IO 1 that are configured to receive supply voltages VDD. When word line driver and control circuit WLDV & LCTRL 2 is turned on and thus demand supply voltages VDD, circuit 110 and circuits 120-5 and 130-5 in circuit 135-5 are invoked to provide supply voltages VDD to the circuits in word line driver and control circuit WLDV & LCTRL 2 that are configured to receive supply voltages VDD. When circuits in memory array ARRAY 8 are turned on and thus demand supply voltages VDD, circuit 110 and circuits 120-7 and 130-7 in circuit 135-7 are invoked to provide supply voltages VDD to the circuits in memory array ARRAY 8 that are configured to receive supply voltages VDD, etc.

Memory macro 1100 in FIG. 11 is used for illustration. Different configurations of memory macro 1100 are within the scope of various embodiments. Circuits other than memory macro 1100 using circuits 110 and 135 are also within the scope of various embodiments.

Exemplary Method

Figure 12:
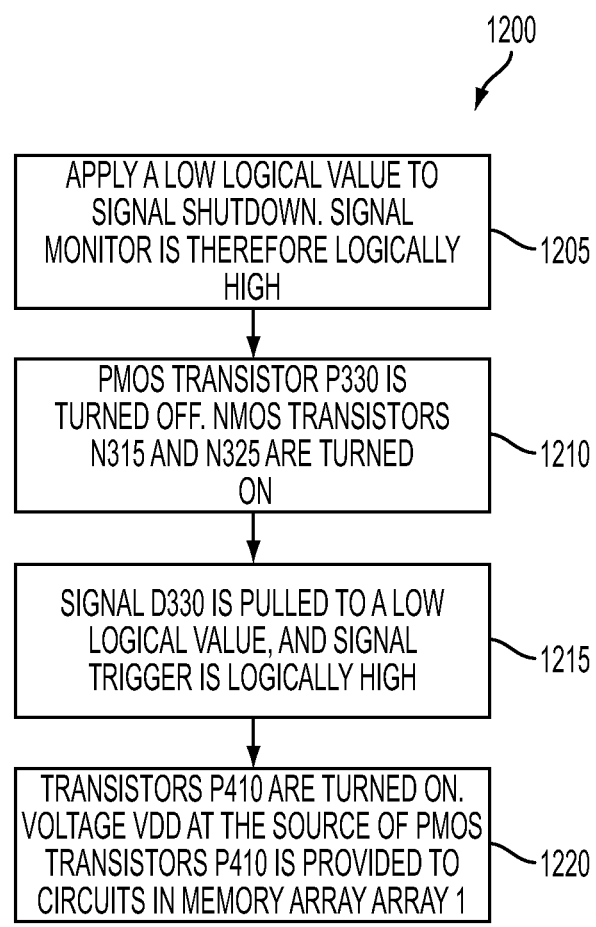
FIG. 12 is a flowchart of a method of operating the memory macro in FIG. 11, in accordance with some embodiments.

FIG. 12 is a flowchart of a method 1200 of operating memory macro 1100 in FIG. 11, in accordance with some embodiments. In this illustration, circuits in memory array ARRAY 1 are turned on and demand a supply voltage VDD. Further, circuit 200 in FIG. 2 is implemented as circuit 110 in FIG. 11. Circuit 300 in FIG. 3 is implemented as circuit 120-1, and circuit 400 in FIG. 4 is implemented as circuit 130-1 in FIG. 11.

In operation 1205, signal ShutDown in FIG. 2 is applied with a low logical value. As a result, memory macro 1100 is out of a shutdown mode, and enters into an active mode, such as a read or a write mode, for example. Because signal ShutDown is logically low, the output of inverter INV217 is logically low, and signal Monitor is logically high.

In operation 1210, because signal ShutDown is logically low, signal 0317 in FIG. 3 is logically low, NMOS transistor N305 is turned off, and PMOS transistor P310 is turned on. Because PMOS transistor P310 is turned on and signal Monitor is logically high, signal GP330 is logically high. PMOS transistor P330 is therefore turned off while NMOS transistors N315 and N325 are turned on.

In operation 1215, because PMOS transistor P330 is turned off and NMOS transistors N315 and N325 are turned on, signal D330 is pulled to a low logical value at the source of NMOS transistor N325. As a result, signal Trigger, by operation of inverter INV327, is logically high. At the same time, NMOS transistor N335 is turned off.

In operation 1220, because signal Trigger is logically high, signal 0407 in FIG. 4 is logically low by operation of inverter INV407. As a result, PMOS transistors P410 are turned on, and the drains of PMOS transistors P410 receive supply voltage VDD from the sources of PMOS transistors P410. Effectively, supply voltage VDD at the sources of PMOS transistors P410, through the drains of PMOS transistors P410 is provided to circuits in memory array ARRAY 1 that are configured to receive supply voltage VDD.

In FIG. 12, circuit 300 in FIG. 3 implemented as circuit 120-1 in FIG. 11 is for illustration. One of circuits 500, 600, 700, 800, 900 and 1000 implemented as circuit 120-1 is within the scope of various embodiments and functions accordingly to provide supply voltage VDD.

Various embodiments of the present disclosure are advantageous over other approaches. Circuits 110, 120 and 130 are configured to provide supply voltages VDD in a parallel manner, a serial manner, or a combination of parallel and serial manner. For example, in a parallel structure, after circuit 110 generates signal Monitor, signal Monitor is applied to a plurality of circuits 120 at the same time. Similarly, when circuits 120 generate signals Trigger, signals Trigger are applied to a plurality of circuits 130 at the same time. In contrast, in a serial manner, after circuit 110 generates signal Monitor, circuit 120 generates signal Trigger, and circuit 130 provides supply voltage VDD at sources of transistor P410 in FIG. 4. Supply voltage VDD then serves as signal Monitor applied to another circuit 120 in the serial chain for circuit 120 to generate another signal Trigger, and circuit 130 then provides another supply voltage VDD. If the serial chain continues, the supply voltage VDD then serves as signal Monitor applied to the next circuit 120, etc.

In some embodiments, the drains of PMOS transistors P210 in FIG. 2 are coupled with the drains of PMOS transistors P410 in FIG. 4. As a result, when signal ShutDown is logically low, the drains PMOS transistors P210 instantly receive voltage VDD from the sources of PMOS transistors P210. The drains of PMOS transistors P410 therefore also instantly receive voltage VDD from the drains of PMOS transistors P210. In some embodiments, because of a load at the drains of PMOS transistors P410, the drains of PMOS transistors P410 have a voltage VDD' (not labeled), which is voltage VDD subtracted from a voltage VLD (not labeled) caused by the load. By the time signal Trigger in FIG. 4 is logically high to turn on PMOS transistors P410, the drains of PMOS transistors P410 receive voltage VDD from the sources of PMOS transistors P410. Effectively, the drains of PMOS transistors P410 change a voltage VLD from voltage VDD' to voltage VDD. As a result, a current flowing through PMOS transistors P410 is smaller than a current flowing through the same PMOS transistors P410 if the drains of PMOS transistors P410 did not receive voltage VDD', but remain at a ground voltage level, for example. In such a situation, the drains of PMOS transistors P410 change from 0 V to voltage VDD, and a larger current flow occurs. In other words, circuits 400 in accordance with various embodiments of the disclosure experience a smaller current flow, and are therefore advantageous.

In some other approaches, a circuit performing a similar function as circuit 120 in FIG. 1 uses a lot of inverters in a daisy chain manner. As a result, the circuit in the other approaches takes a lot of die space and consumes a large power. In contrast, circuits 120 in accordance with various embodiments of the disclosure take a smaller die space and consume less electrical power.

In some embodiments, a voltage providing circuit comprises a first circuit configured to receive a first input signal and a second input signal and to generate an output signal. The first circuit comprises a first transistor configured to switchably couple the second input signal to a first node responsive to the first input signal, a second transistor having a gate terminal coupled with the first node, and a third transistor having a source terminal coupled with a source terminal of the second transistor. The third transistor is configured to set a reference voltage value at the source terminal of the second transistor if the first input signal indicates that the second input signal is pulled from a first voltage value toward a second voltage value and if the second input signal reaches a predetermined voltage value. A second circuit is configured to receive the output signal and to generate an output voltage.

In some embodiments, a voltage providing circuit comprises a first circuit configured to receive a first input signal and a second input signal and to generate an output signal. The first circuit comprises a first transistor configured to switchably couple the second input signal to a first node responsive to the first input signal, a second transistor having a gate terminal coupled to the first node and a drain terminal coupled to a second node, and a third transistor having a gate terminal coupled to the second node. The second transistor and the third transistor are configured to set a reference voltage value at the second node if the first input signal indicates that the second input signal is pulled from a first voltage value toward a second voltage value and if the second input signal reaches a predetermined voltage value. A second circuit is configured to receive the output signal and to generate an output voltage.

In some embodiments, a memory macro comprises a plurality of sections and a plurality of circuits. Each circuit of the plurality of circuits corresponds to a section of the plurality of sections and each circuit of the plurality of circuits is configured to receive a first signal and a second signal and to generate a voltage value for use by the corresponding section. At least one circuit of the plurality of circuits comprises a first transistor configured to switchably couple the second signal to a first node responsive to the first signal, a second transistor having a gate terminal coupled with the first node, and a third transistor having a source terminal coupled with a source terminal of the second transistor. The third transistor is configured to set a reference voltage value at the source terminal of the second transistor if the first signal indicates that the second signal is pulled from a first voltage value toward a second voltage value and if the second signal reaches a predetermined voltage value.

A number of embodiments have been described. It will nevertheless be understood that various modifications may be made without departing from the spirit and scope of the disclosure. For example, various transistors being shown as a particular dopant type, such as N-type or P-type Metal Oxide Semiconductor (NMOS or PMOS) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular level when a signal is activated and/or deactivated. Selecting different voltage levels is within the scope of various embodiments.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A voltage providing circuit comprising:
a first circuit configured to receive a first input signal at a first input and a second input signal at a second input and to generate an output signal, the first circuit comprising:
a first transistor configured to switchably couple the second input signal to a first node responsive to the first input signal;

a second transistor having a gate terminal coupled with the first node;

a third transistor having a source terminal coupled with a source terminal of the second transistor, the third transistor configured to set a logical value at the source terminal of the second transistor if the first input signal indicates that the second input signal is changed from a first voltage value toward a second voltage value and if the second input signal reaches a predetermined voltage value;

a fourth transistor configured to, responsive to the first input signal, switchably couple the first node to a ground reference node separate from the first input and the second input;

a fifth transistor having a drain terminal coupled to the drain terminal of the second transistor and a gate terminal coupled to the first node; and a sixth transistor having a drain terminal coupled to a source terminal of the fifth transistor, wherein a signal provided to the gate of the sixth transistor is provided to an inverter and the output of the inverter is provided to a gate of the first transistor; and a second circuit configured to receive the output signal and to generate an output voltage.

2. The voltage providing circuit of claim 1, further comprising
another first circuit configured to receive the first input signal and the second input signal; and
another second circuit coupled to the another first circuit.

3. The voltage providing circuit of claim 2, wherein
the first circuit and the second circuit are part of a first section of a memory macro;
the another first circuit and the another second circuit are part of a second section of the memory macro; and
the first section and the second section are each different from one another.

4. The voltage providing circuit of claim 1, wherein
the second circuit comprises a plurality of transistors;
first terminals of the plurality of transistors are coupled together and are configured to turn the plurality of transistors on or off based on the output signal;
second terminals of the plurality of transistors are coupled together;
third terminals of the plurality of transistors are coupled together; and
the plurality of transistors is configured to provide a voltage from the second terminals of the plurality of transistors at the third terminals of the plurality of transistors.

5. The voltage providing circuit of claim 4, wherein
the second circuit further comprises an inverter;
an input of the inverter is configured to receive the output signal; and
an output of the inverter is coupled with the first terminals of each transistor of the plurality of transistors.

6. The voltage providing circuit of claim 1, wherein the first circuit further comprises a seventh transistor having a drain terminal coupled to the source terminal of the second transistor.

7. The voltage providing circuit of claim 6, wherein a slew rate of the output signal is based on a size of at least one of the second transistor, the third transistor, or the seventh transistor.

8. A voltage providing circuit comprising:
a first circuit configured to receive a first input signal at a first input and a second input signal at a second input and to generate an output signal, the first circuit comprising:
a first transistor configured to switchably couple the second input signal to a first node responsive to the first input signal;
a second transistor having a gate terminal coupled to the first node and a drain terminal coupled to a second node;
a third transistor having a gate terminal coupled to the second node, the second transistor and the third transistor configured to set a logical value at the second node if the first input signal indicates that the second input signal is changed from a first voltage value toward a second voltage value and if the second input signal reaches a predetermined voltage value;
a fourth transistor configured to, responsive to the first input signal, switchably couple the first node to a ground reference node separate from the first input and the second input;
a fifth transistor having a drain terminal coupled to the drain terminal of the second transistor and a gate terminal coupled to the first node; and
a sixth transistor having a drain terminal coupled to a source terminal of the fifth transistor, wherein a signal provided to the gate of the sixth transistor is provided to an inverter and the output of the inverter is provided to a gate of the first transistor; and
a second circuit configured to receive the output signal and to generate an output voltage.

9. The voltage providing circuit of claim 8, further comprising
another first circuit configured to receive the first input signal and the second input signal; and
another second circuit coupled to the another first circuit.

10. The voltage providing circuit of claim 9, further comprising a third circuit configured to receive the first input signal and generate the second input signal,
wherein
the third circuit is part of a first section of a memory macro;
the first circuit and the second circuit are part of a second section of the memory macro;
the another first circuit and the another second circuit are part of a third section of the memory macro; and
the first section, the second section, and the third section are each different from one another.

11. The voltage providing circuit of claim 8, further comprising a third circuit configured to receive the first input signal and generate the second input signal, wherein
the second circuit is configured to generate the output voltage at a first output node; and
the third circuit is further configured to generate the output voltage at a second output node coupled with the first output node.

12. The voltage providing circuit of claim 8, further comprising a third circuit configured to receive the first input signal and generate the second input signal, wherein
the third circuit comprises a plurality of transistors;
first terminals of the plurality of transistors are coupled together and are configured to receive the first input signal;
second terminals of the plurality of transistors are coupled together;

third terminals of the plurality of transistors are coupled together;

the plurality of transistors is configured to provide a voltage from the second terminals of the plurality of transistors at the third terminals of the plurality of transistors; and the third terminals of the plurality of transistors is configured to carry the second input signal.

13. The voltage providing circuit of claim 12, wherein the third circuit further comprises a first inverter and a second inverter;

an input of the first inverter is configured to receive the first input signal;

an output of the first inverter is coupled with an input of the second inverter; and an output of the second inverter is coupled with the first terminals of the plurality of transistors.

14. The voltage providing circuit of claim 8, wherein the second circuit comprises a plurality of transistors;

first terminals of the plurality of transistors are coupled together and are configured to turn the plurality of transistors on or off based on the output signal;

second terminals of the plurality of transistors are coupled together;

third terminals of the plurality of transistors are coupled together; and the plurality of transistors are configured to provide a voltage from the second terminals of the plurality of transistors at the third terminals of the plurality of transistors.

15. The voltage providing circuit of claim 14, wherein the second circuit further comprises an inverter;

an input of the inverter is configured to receive the output signal; and an output of the inverter is coupled with the first terminals of the plurality of transistors.

16. The voltage providing circuit of claim 8, wherein the first circuit further comprises a seventh transistor having a drain terminal coupled to a source terminal of the second transistor.

17. The voltage providing circuit of claim 16, wherein a slew rate of the output signal is based on a size of at least one of the second transistor, the third transistor, or the seventh transistor.

18. A memory macro comprising:
a plurality of sections; and
a plurality of circuits,
wherein
each circuit of the plurality of circuits corresponds to a section of the plurality of sections, and each circuit of the plurality of circuits is configured to receive a first signal at a first input and a second signal at a second input and to generate a voltage value for use by the corresponding section, at least one circuit of the plurality of circuits comprising:

a first transistor configured to switchably couple the second signal to a first node responsive to the first signal;

a second transistor having a gate terminal coupled with the first node;

a third transistor having a source terminal coupled with a source terminal of the second transistor, the third transistor configured to set a logical value at the source terminal of the second transistor if the first signal indicates that the second signal is changed from a first voltage value toward a second voltage value and if the second signal reaches a predetermined voltage value;

a fourth transistor configured to, responsive to the first signal, switchably couple the first node to a ground reference node separate from the first input and the second input;

a fifth transistor having a drain terminal coupled to the drain terminal of the second transistor and a gate terminal coupled to the first node; and a sixth transistor having a drain terminal coupled to a source terminal of the fifth transistor, wherein a signal provided to the gate of the sixth transistor is provided to an inverter and the output of the inverter is provided to a gate of the first transistor.

19. The memory macro of claim 18, wherein
the first transistor is a transistor of a first type; and
the second transistor and the third transistor are transistors of a second type different from the first type.

20. The memory macro of claim 19, wherein the fifth transistor and the sixth transistor are transistors of the first type.

\* \* \* \* \*